United States Patent [19]

Giebel et al.

[11] 4,435,789
[45] Mar. 6, 1984

[54] CIRCUIT FOR A READ-ONLY MEMORY ORGANIZED IN ROWS AND COLUMNS TO PREVENT BIT LINE POTENTIALS FROM DROPPING

[75] Inventors: Burkhard Giebel, Munich; Hans Moormann, Haar; Lothar Schrader, Munich, all of Fed. Rep. of Germany

[73] Assignee: Siemens Aktiengesellschaft, Berlin & Munich, Fed. Rep. of Germany

[21] Appl. No.: 290,515

[22] Filed: Aug. 6, 1981

[30] Foreign Application Priority Data

Aug. 14, 1980 [DE] Fed. Rep. of Germany ....... 3030867

[51] Int. Cl.$^3$ .............................................. G11C 7/00
[52] U.S. Cl. ..................................... 365/203; 365/104; 365/206
[58] Field of Search ............... 365/104, 189, 191, 203, 365/206

[56] References Cited

U.S. PATENT DOCUMENTS 4,110,840  8/1978  Abe et al. ............................ 365/203
4,185,321  1/1980  Iwahashi et al. ..................... 365/203
4,318,014  3/1982  McAlister et al. ................... 365/203

Primary Examiner—Stuart N. Hecker
Attorney, Agent, or Firm—Herbert L. Lerner; Laurence A. Greenberg

[57] ABSTRACT

Circuit arrangement for a read-only memory organized in rows and columns, including bit lines having potentials applied thereto, and selection circuits being connected to the bit lines, being addressed by a bit line decoder and containing at least one selection transistor having a cut-off voltage and a gate potential, for preventing bit line potentials from dropping below a given value at which the selection circuits become conducting without having been selected by the bit line decoder, including current-feed lines each being connected to a different one of the bit lines for feeding current to the bit lines and for ensuring that for each of the selection circuits not selected by the bit line decoder the difference between at least one gate potential of the participating selection transistors and the respective bit line potential is smaller than the cut-off voltage of the respective selection transistors.

7 Claims, 6 Drawing Figures

CIRCUIT FOR A READ-ONLY MEMORY ORGANIZED IN ROWS AND COLUMNS TO PREVENT BIT LINE POTENTIALS FROM DROPPING

The present invention relates to a circuit for a read-only memory organized in rows and columns to prevent bit line potentials from dropping below a value at which selection circuits, which are connected to the bit lines, which contain at least one selection transistor and which are addressed by a bit line decoder, become conducting without being selected by the bit line decoder.

It is known to divide the bit lines into 8 groups, in non-volatile memories organized in matrix fashion with, for instance, an 8-bit wide data output.

It is furthermore known that the selection of the bit lines from a group takes place through the use of a column switch which connects the selected bit line to the read amplifier of the corresponding data output through a transfer transistor. Therefore, at least as many transfer transistors are provided in a group as there are bit lines belonging to the group. The existing 8 groups are as a rule of identical construction.

However, due to a lowering of the bit line voltages, which will be more fully described hereinbelow, a situation can arise with respect to the voltage, in which the selection transistors also start to become conducting in the case of gates that are not selected by the bit line decoder, since the gate-source voltage of the selection transistors becomes higher than the cut-off voltage although the level at the gate is low.

The current flowing from the read amplifier which is provided through non-selected selection transistors, leads to the condition in which the read amplifier can charge and therefore read-out a selected bit line only after a delay. Due to this, the access time in the transition into the active operating state, can be increased considerably, such as from 400 nanoseconds to 1000 nanoseconds.

It is accordingly an object of the invention to provide a circuit for a read-only memory organized in rows and columns to prevent bit line potentials from dropping, which overcomes the hereinaforementioned disadvantages of the heretofore-known devices of this general type, and to prevent the possibility of the above-mentioned lowering of the bit line potentials because of the capacitive coupling between word and bit lines.

With the foregoing and other objects in view there is provided, in accordance with the invention, a circuit arrangement for a read-only memory organized in rows and columns, including bit lines having potentials applied thereto, and selection circuits being connected to the bit lines, being addressed by a bit line decoder and containing at least one selection transistor having a cut-off voltage and a gate potential, for preventing bit line potentials from dropping below a given value at which the selection circuits become conducting without having been selected by the bit line decoder, comprising current-feed lines or branches each being connected to or inserted into a different one of the bit lines for feeding current to the bit lines therethrough and for ensuring that for each of the selection circuits not selected by the bit line decode the difference between at least one gate potential of the participating selection transistors and the respective bit line potential is smaller in absolute amount than the cut-off voltage of the respective selection transistors.

In accordance with another feature of the invention, there is provided a potential source, the current-feed lines each including a resistor being connected to a different respective bit line and to the first potential source, the resistors and potential source being chosen so as to prevent current from flowing in non-selected selection circuits.

In accordance with a further feature of the invention, the resistors are ohmic resistors.

In accordance with an added feature of the invention, the resistors are formed by MOS transistors connected as loads.

In accordance with an additional feature of the invention, there are provided first and second potential sources, the current-feed lines each including an MOS transistor having a source-drain path connected between a different respective bit line and the first potential source and a gate connected to the second potential source, the potential sources being chosen so as to prevent current from flowing in non-selected selection circuits.

In accordance with again another feature of the invention, the potential source is constant in time.

In accordance with again a further feature of the invention, at least one of the potential sources are constant in time.

In accordance with again an added feature of the invention, there is provided a supply potential source, the first-mentioned potential source being equal to the supply potential source.

In accordance with again an additional feature of the invention, there is provided a supply potential source, the first potential source being equal to the supply potential source.

In accordance with yet another feature of the invention, the potential source is clock-controlled.

In accordance with yet a further feature of the invention, at least one of the potential sources is clock-controlled.

In accordance with yet an added feature of the invention, the MOS transistors of the current-feed lines are of the same type and have the same cut-off voltages as the selection transistors, and the second potential source is higher than the gate potential of at least one selection transistor of non-selection circuits.

In accordance with yet an additional feature of the invention, there is provided a reference potential source, a supply potential source, and a voltage divider generating the second potential source at a tap thereof, the voltage divider including a first MOS transistor connected to the supply potential source as a load and a second MOS gate-drain-connected transistor connected to the reference potential source, the second transistor being of the same type and having substantially the same cut-off voltage as the transistors of the current-feed lines.

In accordance with a concomitant feature of the invention, the read-only memory is switchable between a power-down operating mode and an active operating mode, including a reference potential source, a signal source indicating the power-down operating mode, a first MOS transistor being addressed by the power-down operating mode signal source, a second gate-drain-connected MOS transistor being connected to the reference potential source and being connected in series with the first transistor, the second transistor being of the same type and having substantially the same cut-off voltage as the transistors of the current-feed branches, and a junction point disposed between the transistors forming the second potential source. Other features which are considered as characteristic for the invention are set forth in the appended claims.

Although the invention is illustrated and described herein as embodied in circuit for a read-only memory organized in rows and columns to prevent bit line potentials from dropping, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
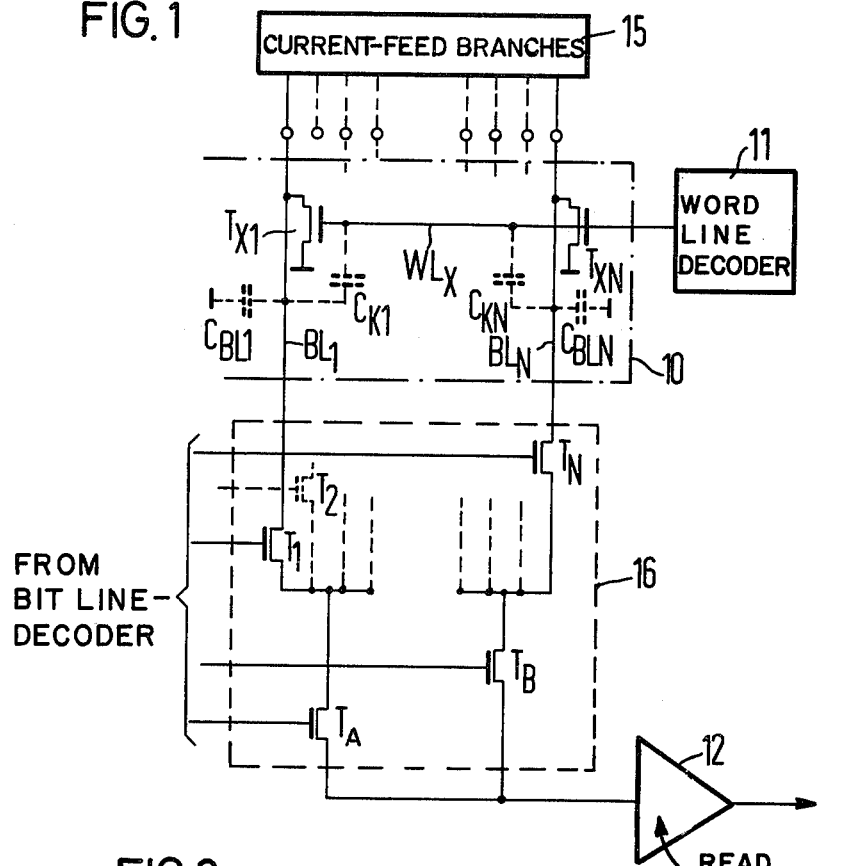
FIG. 1 is a schematic and block circuit diagram of rows of a memory cell field and a general presentation of the circuit arrangement according to the invention.

Referring now to the figures of the drawing and first particularly to FIG. 1 thereof, there is seen a simplified, schematic circuit diagram of part of the cell field of a memory of the abovementioned type, which is assigned to an input/output. Such a cell field contains, for instance, 2K storage locations. Each storage location is formed by an MOS transistor of which two transistors $T_{X1}$ and $T_{XN}$ of a memory cell X are shown in the memory field 10. The storage transistors are addressed row by row through word line decoders and word lines, one word line decoder 11 and one word line $WL_X$ of which are shown for the row X. The column control of the storage transistors takes place through bit lines, two bit lines $BL_1$ and $BL_N$ of which are shown for the two storage transistors $T_{X1}$ and $T_{XN}$. Selection transistors $T_1$ and $T_N$ are inserted into the bit lines. Through the selection transistors $T_1$ and $T_N$, one bit line each can be selected, by means of addresses, by a non-illustrated bit line decoder. Through further selection transistors $T_A$ and $T_B$, a subgroup of bit lines can be selected once more. The information is fed to a read amplifier 12 through the corresponding selection transistors and is brought by the read amplifier to electronic processing circuitry, that is not shown in details.

Storage building blocks of the hereinafore-explained type frequenctly have, besides the active operating mode proper in which write and read processes are carried out, a low-power mode of operation or the "power-down" mode. These two modes of operation are known and are described, for instance, in German Published Non-Prosecuted Application DE-OS No. 27 42 526.

In the power-down mode of operation, all word lines, corresponding to the word line $L_X$ shown in FIG. 1, are at high potential which is approximately equal to the supply voltage $V_{CC}$. When changing from power-down operation to active operation, the voltage level, with the exception of one selected word line, simultaneously changes from the afore-mentioned high level to a low level. Due to the unavoidable capacitive couplings between the word lines and the bit lines, of which two coupling capacities are shown in FIG. 1 by dotted lines and are designated with $C_{K1}$ and $C_{KN}$, negative charges are coupled into all bit lines. The drop in the bit line voltage caused thereby is determined by the magnitude of the coupling capacities compared to the respective parasitic bit line capacities ($C_{BC1}$ to $C_{BCN}$). The value of the bit line voltage at the end of the transition from power-down operation to the active operation, is also determined by the level of the bit line voltage at the beginning of the transition.

Due to the above-mentioned lowering of the bit line voltages, a situation can arise with respect to the voltage, in which the selection transistors $T_1$ to $T_N$ and/or $T_A$ and $T_B$ start to become conducting even in the case of gates that are not selected by the bit line decoder, since the gate-source voltage of the selection transistors becomes higher than the cut-off voltage although the level at the gate is low.

The current flowing from the read amplifier (such as the amplifier 12 in FIG. 1) through non-selected selection transistors leads to the condition in which the read amplifier (12 in FIG. 1) can only delayedly charge and accordingly read-out a selected bit line. Due to this, the access time in the transition into the active operating state can be increased considerably, for instance from 400 nanoseconds to 1000 nanoseconds.

According to FIG. 1 and according to the invention, there are provided current-feed branches which are shown as the block 15 for the bit lines $BL_1$ to $BL_N$. Through these current-feed branches, a current can be fed to each bit line $BL_1$ to $BL_N$, such as for selection transistors $T_1$ to $T_N$ and $T_A$ to $T_B$ of selection circuits 16, that are not selected by the non-illustrated but line decoder. The potential difference between the gates of the selection transistors and the respective bit line is smaller, as to the absolute value, then the cut-off voltage of the respective selection transistor.

Figure 2:
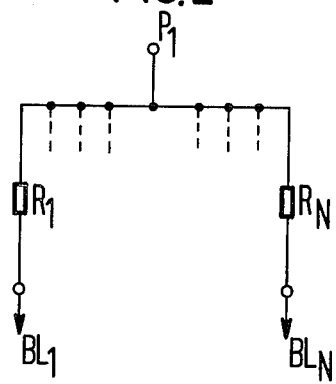
FIG. 2 is a schematic circuit diagram of a first embodiment of current-feed lines or branches according to FIG. 1.

According to the embodiment shown in FIG. 2 for the current-feed branches 15 of FIG. 1, the current-feed branches are formed by respective resistors $R_1$ to $R_N$, which are connected on one hand to the respective bit line $BL_1$ to $BL_N$, and on the other hand are connected to a first potential $P_1$. In this embodiment the respective resistance and the potential $P_1$ are chosen in such a way that no current flows in the non-selected selection circuits, for instance $T_1$ and $T_A$. The resistances $R_1$ to $R_N$ are formed in this case by ohmic resistors.

Figure 3:
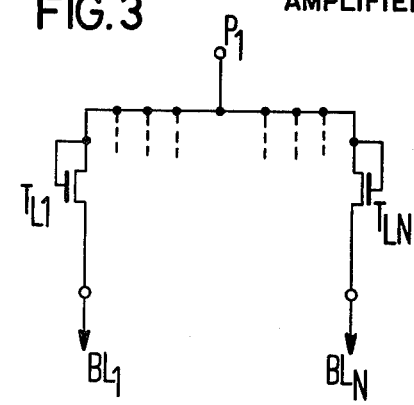
FIG. 3 is a view similar to FIG. 2 of a second embodiment of current-feed branches.

According to a further embodiment, it is also possible for the resistors to be formed by MOS transistors connected as a load. Such an embodiment is shown in FIG. 3, where MOS transistors $T_{L1}$ to $T_{LN}$ connected as a load, are provided; this embodiment of the current-feed branches do not otherwise differ from the embodiment according to FIG. 2.

Figure 4:
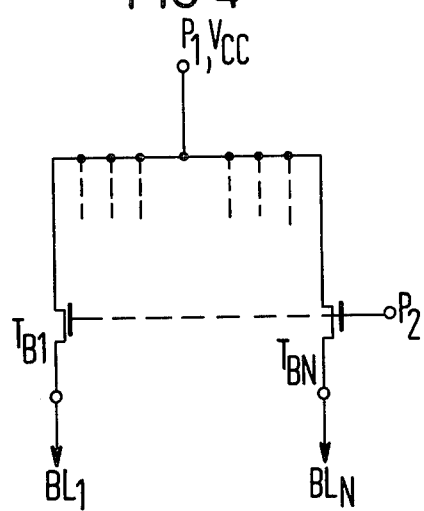
FIG. 4 is another view similar to FIG. 2 of a third embodiment of current-feed branches.

In an embodiment of the current-feed branches shown in FIG. 4, an MOS transistor $T_{B1}$ to $T_{BN}$ is provided for each one. The transistors are connected with their source-drain paths on the one hand to the respective bit line ($BL_1$ to $BL_N$), and on the other hand they are connected to the potential $P_1$ or to the supply voltage $V_{CC}$. The transistors are also connected with their gates to a second potential $P_2$. The potentials are chosen in such a way that no current flows in the non-selected selection circuits, for instance $T_1$, $T_A$ according to FIG. 1.

According to one possiblity, the potentials $P_1$ and $P_2$ may be constant in the embodiments of the current-feed branches according to FIGS. 2 and 4. In particular in this case, the potential $P_1$ can be equal to the supply voltage $V_{CC}$ as shown in the embodiment according to FIG. 4.

On the other hand, the first and/or the second potential $P_1$ and $P_2$ can also be clock-controlled, so that they are effectively switched into the active mode of operation when switching from the power-down mode of operation into the active mode of operation.

In the embodiment of the current-feed branches according to FIG. 4, it is particularly advisable for the MOS transistors $T_{B1}$ to $T_{BN}$ to be of the same type and to have the same cut-off voltage as the transistors $T_1$ to $T_N$ as well as the transistors $T_A$ to $T_B$ of the selection circuits, and for the second potential $P_2$ to be higher than the lowest gate potential of all selection transistors of a selection circuit considered but no selected in this case, for instance $T_1$, $T_A$.

Figure 5:
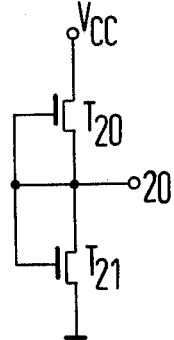
FIG. 5 is a schematic circuit diagram of a voltage divider for generating a predetermined potential.

FIG. 5 shows a circuit for generating the second potential $P_2$ in the form of a voltage divider formed by two MOS transistors $T_{20}$ and $T_{21}$. In the voltage divider the transistor $T_{20}$ which is connected to the supply voltage $V_{CC}$ is connected as a load, and the transistor $T_{21}$ that is connected to reference potential, is of the same type and has approximately the same cut-off voltage as the transistors $T_{B1}$ to $T_{BN}$ of the current-feed branches according to FIG. 4. The second potential $P_2$ can be taken off at a tap 20 of the voltage divider.

Figure 6:
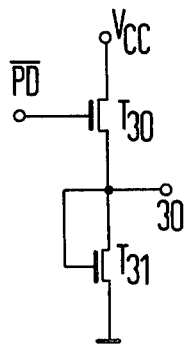
FIG. 6 is a view similar to FIG. 5 of a further embodiment of a circuit for generating a predetermined potential.

In semiconductor memories of the type discussed herein, a signal indicating the power-down mode of operation which is also utilized for making certain circuits of the memory inactive to save power is available in a known manner. This signal, which is customarily designated with reference character $\overline{PD}$, can be utilized to make the above-explained current feed-branches operative. Such a possibility is shown in FIG. 6. The circuit of FIG. 6 contains a first MOS transistor $T_{30}$ which is connected to the supply voltage $V_{CC}$ and is addressed by the signal $\overline{PD}$ indicating the power-down operating mode. The circuit also includes a second gate-drain-connected MOS transistor $T_{31}$ which is connected to reference potential in series with the first transistor $T_{30}$. The second transistor $T_{31}$ in this embodiment is of the same type and has approximately the same cut-off voltage as the transistors $T_{B1}$ to $T_{BN}$ of the current feed-branches according to FIG. 4. At the junction point 30 of the two MOS transistors $T_{30}$ and $T_{31}$, the potential $P_2$ can be taken off and fed into the gates of the transistors $T_{B1}$ to $T_{BN}$ of the current feed-branches according to FIG. 4.

There are claimed:

1. Circuit arrangement for a read-only memory organized in rows and columns, including bit lines having potentials applied thereto, and selection circuits being connected to the bit lines, being addressed by a bit line decoder and containing at least one selection transistor having a cut-off voltage and a gate potential, for preventing bit line potentials from dropping below a given value at which the selection circuits become conducting without having been selected by the bit line decoder, comprising current-feed lines each being connected to a different one of the bit lines for feeding current to the bit lines and for ensuring that for each of the selection circuits not selected by the bit line decoder the difference between at least one gate potential of the participating selection transistors and the respective bit line potential is smaller that the cut-off voltage of the respective section transistors, and including first and second potential sources, said current-feed lines each including an MOS transistor having a source-drain path connected between a different respective bit line and said first potential source and a gate connected to said second potential source, said potential sources being chosen so as to prevent current from flowing in non-selected selection circuits.

2. Circuit arrangement according to claim 1, wherein at least one of said potential sources are constant in time.

3. Circuit according to claim 1, including a supply potential source, said first potential source being equal to said supply potential source.

4. Circuit according to claim 1, wherein at least one of said potential sources is clock-controlled.

5. Circuit arrangement according to claim 1 or 4, wherein said MOS transistors of said current-feed lines are of the same type and have the same cut-off voltages as the selection transistors, and said second potential source is higher than the gate potential of at least one selection transistor of non-selected selection circuits.

6. Circuit arrangement according to claim 5, including a reference potential source, a supply potential source, and a voltage divider generating said second potential source at a tap thereof, said voltage divider including a first MOS transistor connected to said supply potential source as a load and a second MOS gate-drain-connected transistor connected to said reference potential source, said second transistor being of the same type and having substantially the same cut-off voltage as said transistors of said current-feed lines.

7. Circuit arrangement according to claim 5, wherein the read-only memory is switchable between a power-down operating mode and an active operating mode, including a reference potential source, a signal source indicating the power-down operating mode, a first MOS transistor being addressed by said power-down operating mode signal source, a second gate-drain-connected MOS transistor being connected to said reference potential source and being connected in series with said first transistor, said second transistor being of the same type and having substantially the same cut-off voltage as said transistors of said current-feed branches, and a junction point disposed between said transistors forming said second potential source.

* * * * *